United States Patent [19]

Harp

[11] 3,942,130

[45] Mar. 2, 1976

[54] COAX-TO-RADIAL TRANSITION

[75] Inventor: Robert S. Harp, Westlake Village, Calif.

[73] Assignee: Hughes Aircraft Company, Culver City, Calif.

[22] Filed: Dec. 30, 1974

[21] Appl. No.: 537,820

[52] U.S. Cl..................... 330/34; 330/53; 333/21 R; 333/22 R; 333/33

[51] Int. Cl.²..... H01P 1/16; H03F 3/54; H03F 3/60

[58] Field of Search.............. 333/6, 9, 24 R, 33–35, 333/21 R, 95 R, 96, 22 R, 97 R, 98 R; 330/4.9, 34, 53; 331/56, 101; 343/754, 771

[56] References Cited

UNITED STATES PATENTS 3,524,151 8/1970 Safran ............................ 343/771 X 3,582,813 6/1971 Hines ............................... 333/34 X 3,656,165 4/1972 Walter et al. ....................... 343/754

*Primary Examiner*—Paul L. Gensler

*Attorney, Agent, or Firm*—John Holtrichter, Jr.; W. H. MacAllister, Jr.

[57] ABSTRACT

A transmission line transition for coupling together a coaxial transmission line and a parallel plane radial transmission line, the transition including upper and lower circular plates having conforming inner curved surfaces spaced from each other to define an air dielectric transmission line comprising, in succession, a coaxial air line section, a transition air line section, and a radial air line section.

15 Claims, 4 Drawing Figures

COAX-TO-RADIAL TRANSITION

The invention herein described was made in the course of or under a contract with the United States Air Force.

BACKGROUND OF THE INVENTION

The background of the invention will be set forth in two parts.

1. Field of the Invention

This invention relates to transmission line systems and more particularly to a coax-to-radial transmission line transition.

2. Description of the Prior Art

Impedance matching structures for reducing radiation loss at junctions between different types of electric transmission lines have been in use for some time. In the past, these matching structures have been useful in reducing radiation losses at junctions between two-conductor transmission lines, such as coaxial lines and the like, and at microstrip lines, for example.

In the area of matching structures to match coaxial and parallel plane radial transmission lines, the prior art includes devices consisting of conical sections to match the two lines, the sections having abruptly changing stepped portions or geometries. This introduced discontinuities resulting in undesired reflections. Also, the sharp corners limited the power handling capability of these transitions. It should therefore be evident that a coax-to-radial transition that has no abrupt discontinuities in its geometry would constitute a significant advancement of the art.

SUMMARY OF THE INVENTION

In view of the foregoing factors and conditions characteristic of the prior art, it is a primary object of the present invention to provide an improved coax-to-radial transition for coupling together a coaxial transmission line and a parallel plane radial transmission line.

Another object of the present invention is to provide a relatively simple-to-construct and efficient coax-to-radial transition having a smoothly curved transmission air line with no abruptly changing geometry.

Still another object of the present invention is to provide a coax-to-radial transition having frequency independent matching.

Yet another object of the present invention is to provide a coax-to-radial transition having the ability to alter its line gap without significantly changing the electrical characteristics of the transition.

Yet a further object of the present invention is to provide a coax-to-radial transition capable of handling relatively high power radio frequency electromagnetic fields.

Still a further object of the present invention is to provide a coax-to-radial transition having a zero rate of change of impedance with respect to electrical length at the coaxial input to eliminate reflections thereat.

In accordance with an embodiment of the present invention, a transmission line transition for coupling together a coaxial transmission line and a parallel plane radial transmission line includes a lower circular plate having an upper surface with a central curved toroidal portion, and an upper circular plate having a lower surface conforming to the shape of the upper surface of the lower circular plate. The invention also includes spacing means disposed between the surfaces for maintaining a desired spacing distance between the surfaces and thereby defining successively a coaxial air line section, a transition air line section, and a radial air line section, coextensive with the plates.

A coaxial terminal connector may also be mounted on the upper circular plate at the apex of the curved surfaces, the inner conductor thereof being electrically connected to the lower circular plate and the outer conductor thereof being electrically connected to the upper circular plate.

Preferably the curved surfaces have a constant radius and describe a 90° segment.

The features of the present invention which are believed to be novel are set forth with particularity in the appended claims. The present invention, both as to its organization and manner of operation, together with further objects and advantages thereof, may best be understood by making reference to the following description taken in conjunction with the accompanying drawings in which like reference characters refer to like elements in the several views.

DESCRIPTION OF THE PREFERRED EMBODIMENTS

Figure 1:
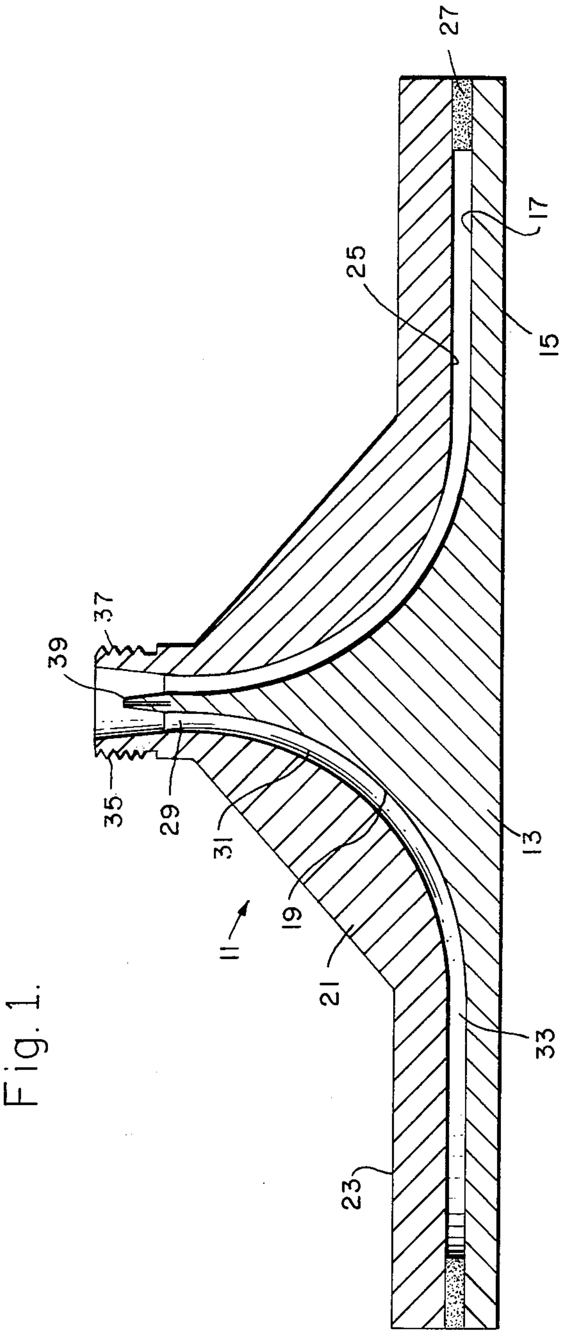
FIG. 1 is a sectional view in elevation of a coax-to-radial transition in accordance with the present invention.

Referring now to the drawings and more particularly to FIG. 1, there is shown a transmission line transition 11 for coupling together a coaxial transmission line and a parallel plane radial transmission line. The transition 11 includes a lower circular plate 13 having a lower planar surface 15 and an upper surface 17 with a central curved portion 19. The transition 11 also includes an upper circular plate 21 having an arbitrary irregular upper surface 23 and a lower surface 25 conforming to the shape but spaced from the upper surface 17 of the lower circular plate 13.

The spacing between the upper and lower plates is maintained at the desired distance by an annular spacing ring 27 disposed at the outer periphery of the plates. The spacing ring in this embodiment is fabricated from a conventional power absorbing material, while the plates are of a conductive material such as cast or machined aluminum, for example, or the plates may be of a plastic material coated on their adjacent inner surfaces with a conductive layer.

The gap between the surfaces 17 and 25, maintained by the ring 27, define successively a coaxial air line section 29, a transition air line section 31 and a radial air line 33, coextensive with the plates. It should be evident that the line gap may be altered by changing the height of the ring 27 without significantly changing the electrical characteristics of the transition 11.

As seen in FIG. 1, in this embodiment the transition line section 31 has a constant radius curvature, which section extends for 90° segment. The radius for this particular application is about 2 inches. The central, uppermost portion 29 of the air line terminates in a coaxial connector 35, preferably a constant impedance type such as a conventional N connector, for example, with an outer threaded sleeve 37 and an inner terminal 39.

Figure 2:
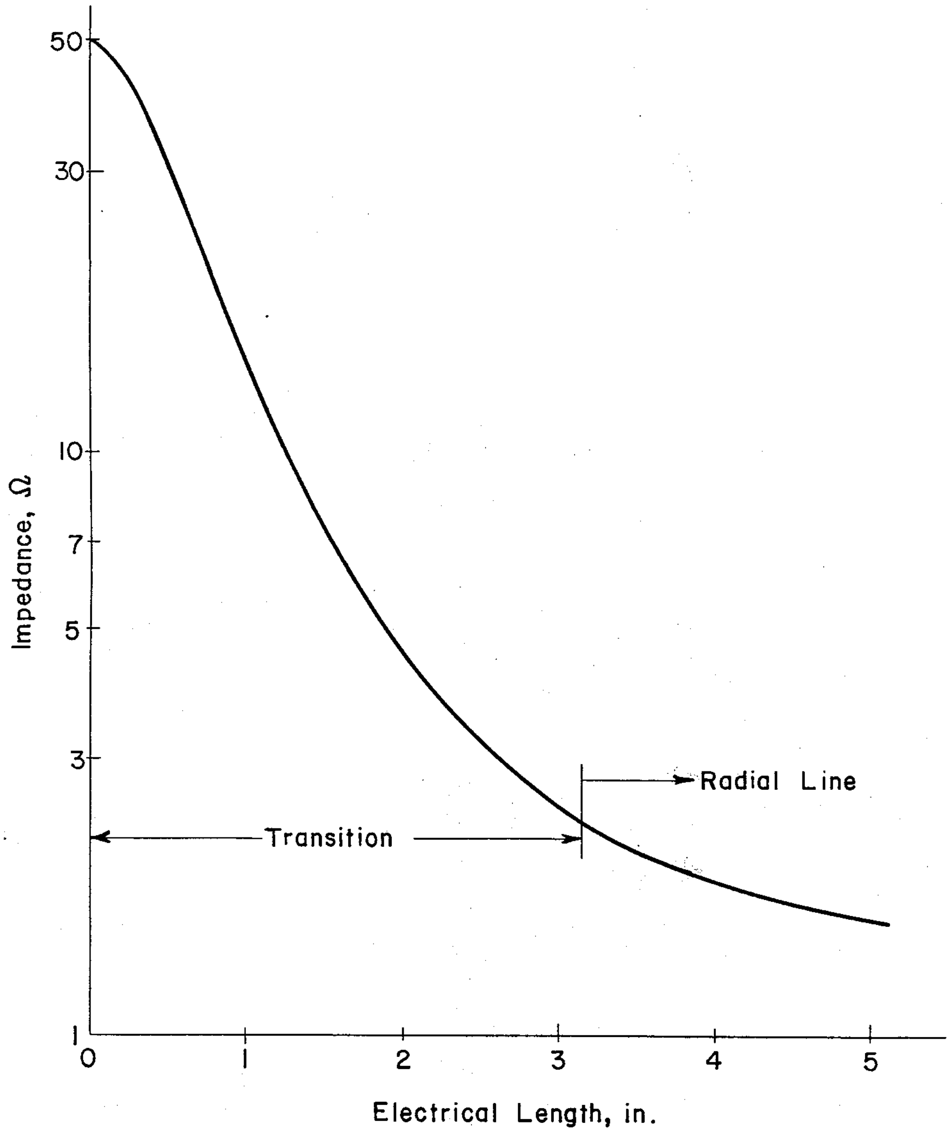
FIG. 2 is a graphical representation of wave impedance of coax-to-radial line transition versus electrical length for the device of FIG. 1.

Referring to the impedance curve of FIG. 2, it can be seen that the transition 11 provides a zero rate of change of impedance with respect to electrical length at the coaxial input, which effectively eliminates undesired reflections at this point.

Figure 3:
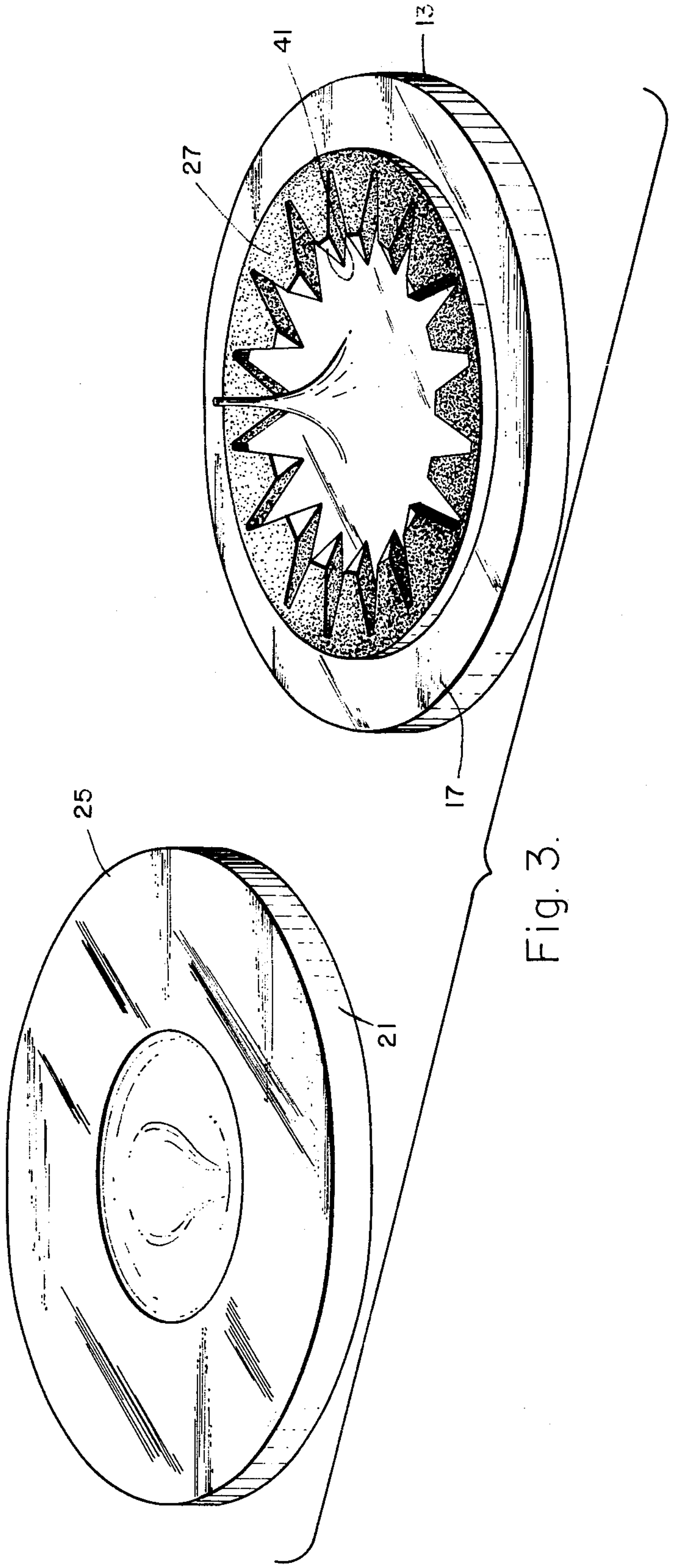
FIG. 3 is a perspective view of the inner surface of the two circular discs of the transition of FIG. 1, including an energy absorbing ring.

FIG. 3 shows in perspective the conforming inner surfaces 17 and 25, and also the power absorbing ring 27 is clearly illustrated. The symmetrically disposed absorbing ring's fingers 41 extending radially inwardly provide for a smooth transition, and therefore, no undesired reflections are produced.

Referring now to the sectional view of another embodiment of the present invention, there is shown a transition 51 having plates 13' and 21' with respective inner surfaces 17' and 25', similar to those shown in FIG. 1. In this embodiment, spacing ring 27' is annular and of conductive material, such as aluminum, for example, and a plurality of negative resistance diodes 53, such as IMPATT or GUNN types, are symmetrically disposed in a circle spaced from the spacing ring by a distance preferably close to approximately one-quarter wavelength. These diodes are well known in the art and have a reflection coefficient greater than one so that power incident on the diodes is amplified and reflected back toward a coax connector 35'. Conventional waveguide means may be employed to provide bias potential to the electrodes of the diodes and will therefore not be described in detail herein.

The transition may also include a mode filter 55 in the form of radially extending grooves 57 about a quarter wavelength deep disposed symmetrically between the diodes. The grooves are partially filled with a conventional lossy material 59, as is also well known in the art. Further, this, or any other embodiment of the invention, may be provided with an impedance matching structure 61. This structure may take the form of a circular ridge depending from the lower surface 25' of the order of approximately one-quarter wavelength upstream of the ring of diodes 53.

Figure 4:
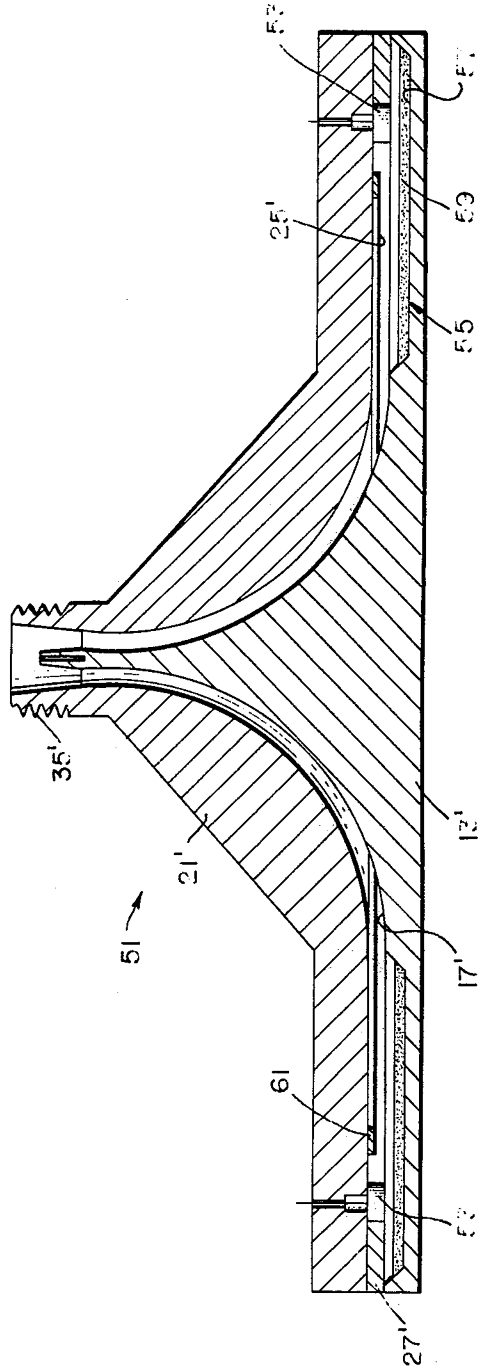
FIG. 4 is a sectional view of a coax-to-radial line transition in accordance with another embodiment of the invention.

In operation of the device of FIG. 4, the coax-to-radial transition may be used as an amplifier by utilizing a circulator (not shown) connected to the transition's coaxial connector 35' in such a manner that input energy to be amplified is coupled to an input port of the circulator and then out its second port. The second port is coupled to the connector 35' so that the energy enters the transition device. The input signal energy is amplified by the diodes 53 and is then coupled back through its coaxial connector 35 to the same second port of the circulator, and out a third or output port thereof. The transition in accordance with the present invention provides a practical device for use with electromagnetic energy having frequencies between DC and approximately 28 GHz, the basic limiting factor being the frequency handling capability of the coax connector. The device shown in FIG. 1 was designed to operate at x-band (10 GHz) and has a plate diameter of approximately 8 inches and a 1 inch wide spacing ring, the height of the spacing ring being approximately 0.080 inch.

It should be understood that the materials described for constructing the various embodiments of the invention are not critical and any material generally known to be suitable for a particular application may be utilized. Furthermore, it should be understood that the present invention has been shown and described with reference to particular embodiments; nevertheless, various changes and modifications which are obvious to persons skilled in the art to which the invention pertains are deemed to lie within the spirit, scope and contemplation of the invention. For example, the transition air line section 31 may be any smooth curve and need not have a constant radius of curvature.

What is claimed is:

1. A transmission line transition for coupling together a coaxial transmission line and a parallel plane radial transmission line, comprising:

a lower circular plate having an upper surface of revolution generated by a smooth curve segment concave with respect to an axis of revolution and rotated about said axis, one end of said curve segment being relatively closely spaced from said axis while the other end of said curve segment being approximately parallel to a line perpendicular to said axis;

an upper circular plate having a lower surface of revolution conforming to the shape of said upper surface of said lower circular plate; and separation means disposed between said upper and lower surfaces of revolution for maintaining a desired uniform separation distance between said surfaces and thereby defining successively a coaxial air line section, a smooth transition air line section, and a radial air line section coextensive with said plates.

2. The transition according to claim 1, also comprising coax coupling means including a coaxial terminal connector mounted on said upper circular plate coaxial with said axis, an inner conductor of said connector being electrically connected to said lower circular plate at the portion of said surface of revolution generated by said one end of said curve line segment, and an outer conductor thereof being electrically connected to said upper circular plate for electromagnetically coupling energy from said coaxial terminal connector to said coaxial air line section.

3. The transition according to claim 1, wherein said curved segment has a constant radius.

4. The transition according to claim 3, wherein said plates have a diameter of approximately 8 inches and said constant radius is approximately 2 inches.

5. The transition according to claim 3, wherein said curve segment is a circular quadrant.

6. The transition according to claim 1, also comprising a power absorbing structure disposed symmetrically about said axis in said radial air line section.

7. The transition according to claim 1, wherein said spacing means includes a conductive annular ring disposed adjacent the outer periphery of said circular plates.

8. The transition according to claim 7, wherein said annular ring has a width of approximately 1 inch and has a length dimension of approximately 0.080 inch.

9. The transition according to claim 7, also comprising negative resistance means including a plurality of negative resistance elements disposed symmetrically about said axis in said radial air line section spaced from the inner peripheral edge of said conductive annular ring.

10. The transition according to claim 9, also comprising mode filter means including radially extending grooves in said upper surface in said radial air line section symmetrically between said negative resistance elements, said grooves being partially filled with an energy-absorbing lossy material.

11. The transition according to claim 10, wherein said grooves are approximately one-quarter wavelength deep with respect to the wavelength of electromagnetic energy propagating in said air line sections.

12. The transition according to claim 9, also comprising impedance matching means including an annular ridge depending from said lower surface in said radial air line section upstream of said negative resistance elements for matching the impedance of said radial air line section to said negative resistance elements.

13. The transition according to claim 12, wherein said ridge is spaced from said negative resistance elements by approximately one-quarter wavelength.

14. The transition according to claim 9, wherein said negative resistance elements are IMPATT diodes and further comprising means associated with said plates for introducing to said diodes an operating bias voltage potential.

15. The transition according to claim 9, wherein said negative resistance elements are GUNN diodes, and further comprising means associated with said plates for introducing to said diodes an operating bias voltage potential.

* * * * *